(12) United States Patent
Kim et al.

(10) Patent No.: US 11,678,505 B2
(45) Date of Patent: Jun. 13, 2023

(54) CURABLE COMPOSITION COMPRISING HYGROSCOPIC PARTICLE AND DISPLAY DEVICE COMPRISING THE SAME

(71) Applicant: LG Display Co., Ltd., Seoul (KR)

(72) Inventors: SungHee Kim, Daejeon (KR); JaeBin Song, Seoul (KR); SuYeon Lee, Seoul (KR); JungHyuk Park, Seoul (KR); SungDoo Back, Seoul (KR); JaeMin Myoung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 313 days.

(21) Appl. No.: 17/039,056

(22) Filed: Sep. 30, 2020

(65) Prior Publication Data
US 2021/0098742 A1  Apr. 1, 2021

(30) Foreign Application Priority Data
Oct. 1, 2019 (KR) .................. 10-2019-0121696

(51) Int. Cl.
| | | |
|---|---|---|
| *H10K 50/844* | (2023.01) | |
| *G03F 7/00* | (2006.01) | |
| *G03F 7/004* | (2006.01) | |
| *H10K 59/38* | (2023.01) | |
| *H01L 51/52* | (2006.01) | |
| *H01L 27/32* | (2006.01) | |

(52) U.S. Cl.
CPC ........ *H01L 51/5253* (2013.01); *G03F 7/0007* (2013.01); *G03F 7/0045* (2013.01); *H01L 27/322* (2013.01)

(58) Field of Classification Search
None
See application file for complete search history.

(56) References Cited

U.S. PATENT DOCUMENTS

| | | | |
|---|---|---|---|
| 5,792,822 A | 8/1998 | Miyabayashi et al. | |
| 2004/0047060 A1 | 3/2004 | Araki et al. | |
| 2007/0152212 A1* | 7/2007 | Cho ..................... | H01L 51/5259 257/40 |
| 2014/0322526 A1* | 10/2014 | Dollase .................. | C09J 193/00 522/112 |
| 2017/0222183 A1* | 8/2017 | Cho ........................ | H01L 23/26 |
| 2020/0212349 A1* | 7/2020 | Li .......................... | H01L 51/525 |
| 2021/0102013 A1* | 4/2021 | Song ...................... | B01J 20/226 |

FOREIGN PATENT DOCUMENTS

| | | |
|---|---|---|
| CN | 1992371 A | 7/2007 |
| CN | 104962120 A | 10/2015 |
| CN | 106009812 A | 10/2016 |

OTHER PUBLICATIONS

Chinese Office Action dated Dec. 22, 2022 issued in Patent Application No. 202011043547.1 w/English Translation (15 pages).

\* cited by examiner

*Primary Examiner* — Nduka E Ojeh
(74) *Attorney, Agent, or Firm* — Polsinelli PC

(57) ABSTRACT

Provided are a curable composition and a display device which include a hygroscopic particle comprising a metal core and a silane surface modification part connected to the metal core, to provide an encapsulation part having excellent anti-moisture and optical properties.

16 Claims, 27 Drawing Sheets

CURABLE COMPOSITION COMPRISING HYGROSCOPIC PARTICLE AND DISPLAY DEVICE COMPRISING THE SAME

CROSS REFERENCE TO RELATED APPLICATION

This application claims priority from Korean Patent Application No. 10-2019-0121696, filed on Oct. 1, 2019, which is hereby incorporated by reference in its entirety.

BACKGROUND

Field of the Disclosure

The present disclosure relates to a curable composition and a display device.

Description of the Background

An organic electric device is a device including one or more organic layers consisting of an organic material. The organic electric device includes organic light emitting diodes (OLEDs), organic solar cells, organic photoreceptors, or organic transistors and the like.

The organic light emitting device may be included in a display device. However, the organic layer included in the organic light emitting device may be oxidized very easily by outside materials such as moisture or oxygen. The display device may include an encapsulation part to prevent the outside materials such as the moisture or the oxygen from penetrating the organic electric element.

As s result, an excellent hygroscopicity and optical performance are required in the encapsulation part for protecting the organic electric element from the outside materials such as the moisture or the oxygen.

SUMMARY

Accordingly, the present disclosure is to provide a curable composition capable of forming an encapsulation part excellent in hygroscopicity and optical performance.

In addition, the present disclosure provides a display device including an encapsulation part having excellent hygroscopicity and optical performance.

Further, the present disclosure provides a curable composition comprising a hygroscopic particle and a photocurable monomer.

The hygroscopic particle comprises a metal core comprising a rare earth metal and a silane surface modification part connected to the metal core.

The metal core may comprise a hydroxide of the rare earth metal.

The silane surface modification part may by formed by dehydration condensation reaction between a silane coupling agent and the rare earth metal.

A diameter of the hygroscopic particles may be 1 nm to 100 nm.

The hygroscopic particle comprises a partial structure represented by the following chemical formula 1 on the surface:

$$Si(OX)_a Y_b \qquad \text{[Chemical Formula 1]}$$

In the chemical Formula 1, a and b are each an integer from 1 to 3, a+b is 4, X is a metal atom of the metal core, Y is, independently of each other, a hydroxy group, an alkyl group of C1-C20, or an alkenyl group of C2-C20, and the alkyl group and the alkenyl group may be substituted or unsubstituted with at least one of an acryloxy group, a methacryloxy group, an amine group, a mercaptoacryloxy group, a mercaptomethacryloxy group, and a glycidoxy group, respectively.

The photocurable monomer may comprise a (meth) acryloyl group.

According to the other aspect, aspects may provide a display device comprising a substrate, an organic electric element located on the substrate and an encapsulation part.

An encapsulation part comprises a hygroscopic particle, is positioned on a peripheral portion of the substrate, and surrounds a side surface of the organic electric element. The hygroscopic particle comprises a rare earth metal core and a silane surface modification part connected to the metal core The encapsulation part further comprises a (meth) acrylate resin.

The hygroscopic particle is dispersed in the (meth) acrylate resin.

The display device further comprises a encapsulation substrate facing the substrate, a color filter positioned on one surface of the encapsulation substrate, and a thin film transistor positioned on one surface of the substrate.

The display device further comprises a passivation layer positioned to cover the upper and side portions of the organic electric element.

A portion of the encapsulation part is located on the passivation layer.

The display device further comprises a filling resin filling a gap between the organic electric element and the encapsulation substrate.

According to exemplary aspects, there are provided a curable composition and a display device, which include a hygroscopic particle comprising a metal core and a silane surface modification part connected to the metal core, to provide an encapsulation part having excellent anti-moisture and optical properties.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
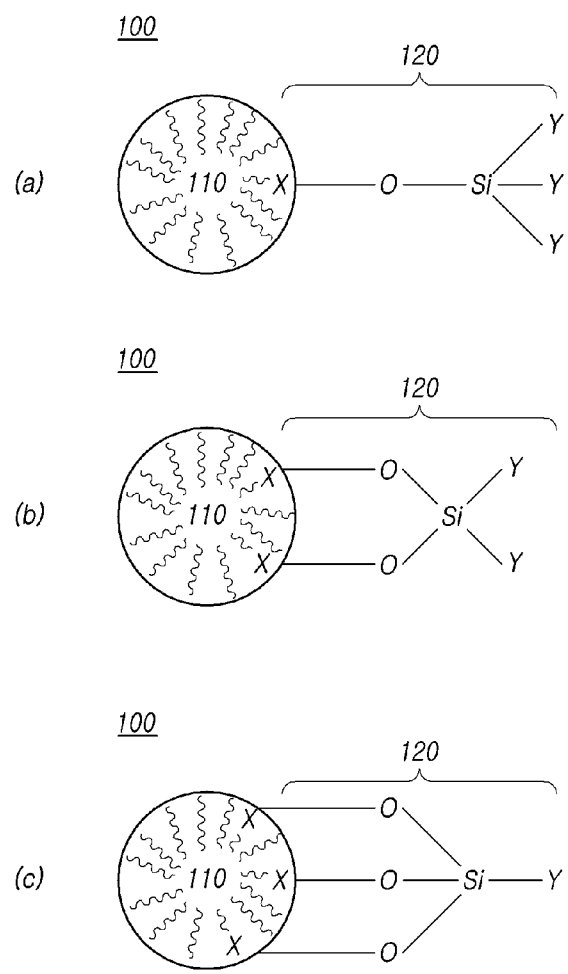
FIG. 1 is a view schematically showing a hygroscopic particle according to aspects.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

A curable composition according to aspects comprises a hygroscopic particle and a photocurable monomer.

FIG. 1 is a view schematically showing a hygroscopic particle according to aspects.

Referring to FIG. 1, the hygroscopic particle 100 comprises a metal core 110 and a silane surface modification part 120.

The metal core 110 comprises a rare earth metal. When the metal core 110 includes the rare earth metal, it may mean, for example, that the metal core 110 includes the rare earth metal atom.

The metal core 110 may comprise one or more selected from the group consisting of lanthanum (La), Scandium (Sc), Yttrium (Y), Cerium (Ce), Neodymium (Nd), Promethium (Pm), Samarium (Sm), Gadolinium (Gd), Terbium (Tb), Holmium (Ho), Erbium (Er), Thulium (Tm), Ytterbium (Yb) and ruthenium (Lu). When the metal core 110 includes the rare earth metal, the hygroscopic particle 100 have excellent hygroscopicity and may be transparent so that the curable composition according to an aspect may form an encapsulation part excellent in hygroscopicity and optical performance.

The metal core 110 may comprise a hydroxide of the rare earth metal. For example, the metal core 110 may comprise a hydroxide of one or more selected from the group consisting of lanthanum (La), Scandium (Sc), Yttrium (Y), Cerium (Ce), Neodymium (Nd), Promethium (Pm), Samarium (Sm), Gadolinium (Gd), Terbium (Tb), Holmium (Ho), Erbium (Er), Tolium (Tm), Ytterbium (Yb) and ruthenium (Lu). When the metal core 110 includes the hydroxide of the rare earth metal, the metal core 110 may have a specific crystal structure, and the surface of the metal core 110 may be modified through a dehydration-condensation reaction with a silane coupling agent including a silanol functional group.

As one example, the metal core 110 may comprise lanthanum hydroxide (La(OH)3). When the metal core 110 includes the lanthanum hydroxide (La(OH)3), the hygroscopic particle 100 have excellent hygroscopicity and may be transparent so that the curable composition according to an aspect may form an encapsulation part excellent in hygroscopicity and optical performance.

The silane surface modification part 120 is connected to the metal core 110. That the silane surface modification part 120 is connected to the metal core 110 may mean, for example, that the silane surface modification part 120 forms a X-O-Si bond. At this time, the rare earth metal atom included in the metal core 110 is indicated by X.

For example, (a) to (c) of FIG. 1 schematically show aspects in which the silane surface modification part 120 is connected to the metal core 110. (a) of FIG. 1 shows an example in which the Si element of the silane surface modification part 120 and the rare earth metal atom X of the metal core 110 are connected by one "—O—" bond. (b) of FIG. 1 shows an example in which the Si element of the silane surface modification part 120 and the rare earth metal atom X of the metal core 110 are connected by two "—O—" bonds. (c) of FIG. 1 shows an example in which the Si element of the silane surface modification part 120 and the rare earth metal atom X of the metal core 110 are connected by three "—O—" bonds. The hygroscopic particles contained in the curable composition may be mixed with each of the aspects shown in (a) to (c) of FIG. 1.

The silane surface modification part 120 may be formed by dehydration condensation reaction between a silane coupling agent and the rare earth metal. For example, when the above mentioned silane coupling agent includes a hydroxyl group, and the metal core 110 includes the hydroxide of the rare earth metal atom X, the silane surface modification part 120 may be formed by the dehydration condensation reaction between the metal core 110 and the hydroxyl of the silane coupling agent. The dehydration condensation reaction may be performed, for example, under acidic conditions. Connecting the silane coupling agent to the surface of the metal core 110 by the dehydration condensation reaction may be referred to as modifying the surface of the metal core 110. The metal nanoparticle may have condensation between particles and deteriorate the intended physical properties. However, when the surface of the metal core 110 is modified by the silane coupling agent as described above, the dispersibility of the metal core 110 may be improved.

The type of the silane coupling agent that may be used to modify the surface of the metal core 110 is not particularly limited as long as it may improve the dispersibility of the metal core 110. For example, the silane coupling agent is one or more selected from the group consisting of 3-methacryloxypropyl trimethoxysilane, 3-methacryloxypropyltriethoxysilane, Vinyl trimethoxysilane, Vinyl triethoxysilane, Methacryloxymethyltrimethoxysilane, Methacryloxymethyltriethoxysilane, 3-aminopropyltriethoxysilane, 3-aminopropyltrimethoxysilane, 3-mercaptoacryloxypropyl trimethoxysilane, 3-mercaptoacryloxypropyltriethoxysilane; 3-glycidoxypropyltrimethoxysilane, 3-glycidoxypropyltriethoxysilane, N-phenylaminopropyl trimethoxysilane, N-phenylaminopropyltriethoxysilane and hexamethyldisilazane.

The hygroscopic particle 100 may be a nanoparticle. A diameter of the hygroscopic particle 100 may be 1 nm to 100 nm. The lower limit of the diameter of the hygroscopic particle 100 may be, for example, 3 nm or more or 5 nm or more. The upper limit of the diameter of the hygroscopic particle 100 may be, for example, 50 nm or less or 30 nm or less. In this specification, the diameter of the hygroscopic particle 100 may mean the diameter of the hygroscopic particle 100 observed by a scanning electron microscope (SEM).

When the diameter of the hygroscopic particle 100 satisfies the above-described range, the curable composition according to aspects may form an encapsulation part having excellent hygroscopicity and excellent optical performance.

The hygroscopic particle comprises a partial structure represented by the following chemical formula 1 on the surface.

   [Chemical Formula 1]

In the chemical Formula 1, a and b are each an integer from 1 to 3, a+b is 4.

In the chemical Formula 1, X is a metal atom of the metal core 100.

In the chemical Formula 1, Y is, independently of each other, a hydroxy group, an alkyl group of C1-C20, or an alkenyl group of C2-C20, and the alkyl group and the alkenyl group may be substituted or unsubstituted with at least one of an acryloxy group, a methacryloxy group, an amine group, a mercaptoacryloxy group, a mercaptomethacryloxy group, and a glycidoxy group, respectively.

The partial structure represented by the chemical formula 1 may be a partial structure constituting the silane surface modification part 120. Since the hygroscopic particles 100 include the partial structure represented by the chemical formula 1, the surface of the metal core 110 is modified so that the hygroscopic particles 100 may have excellent dispersibility.

The photocurable monomer may mean a monomer that forms a polymer by initiating a polymerization reaction by irradiation of light. The photo-curable monomer may mean a monomer that may be cured with initiation reaction by free radicals or cations which are formed by irradiation with active energy rays such as ultraviolet rays and electron beams.

The photocurable monomer may be a monomer having a functional group capable of initiating a polymerization reaction by irradiation of light and being cured. The photocurable monomer may be, for example, a monomer that may be cured by ultraviolet light having a wavelength of 300 nm to 500 nm.

For example, the photocurable monomer may comprise a functional group including an ethylene-like unsaturated double bond such as acryloyl group, methacryloyl group, acryloyloxy group or methacryloyloxy group, or functional group such as epoxy group or oxetane group. In one exemplary example, the photocurable monomer may comprise a (meth) acryloyl group. The (meth) acryloyl group may be referred as one of acryloyl group, methacryloyl group and their combination.

The photocurable monomer may satisfy chemical formula 2 as follows.

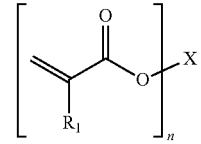   [Chemical formula 2]

In chemical formula 2, R1 is hydrogen or an alkyl group of C1-C4, n is an integer of 2 or higher, and X may be a linear, branched or cyclic alkyl or alkenyl group or mixed with their combination.

For example, X may be the alkyl group of C3-C30, the alkyl group of C4-C28, the alkyl group of C6-C28, the alkyl group of C8-C22 or the alkyl group of C12-C20. Also, X may be the alkenyl group of C3-C30, the alkenyl group of C4-C28, the alkenyl group of C6-C28, the alkenyl group of C8-C22 or the alkenyl group of C12-C20.

The above-mentioned photocurable monomer may be, for example, one or more selected from the group consisting of methyl (meth) acrylate, ethyl (meth) acrylate, butyl (meth) acrylate, trimethylolpropane tri (meth) acrylate, 2-hydroxyethyl (meth) Acrylate, 2-hydroxypropyl (meth) acrylate, pentaerythritol tri (meth) acrylate, ethylene glycol di (meth) acrylate and 2-ethylhexyl (meth) acrylate.

In the curable composition of one example, the hygroscopic particle may be included at 0.1 to 5 parts by weight, and the photocurable monomer may be included at 90 to 99.9 parts by weight. In the curable composition of the other example, the hygroscopic particle may be included at 0.1 to 3 parts by weight, and the photocurable monomer may be included at 90 to 99.9 parts by weight. In the curable composition of another example, the hygroscopic particle may be included at 0.1 to 2 parts by weight, and the photocurable monomer may be included at 90 to 99.9 parts by weight. When the curable composition includes the hygroscopic particles and the photocurable monomer in the above-described weight ratio, the curable composition provide an encapsulation part which is transparent, has a low haze, and is excellent in hygroscopicity.

In an aspect, the photocurable composition may include an initiator. The above-described initiator may be, for example, a photopolymerization initiator. As the photopolymerization initiator, for example, a cationic photopolymerization initiator can be used.

As the cationic photopolymerization initiator, an onium salt- or organometallic salt-based ionized cationic initiator, or an organic silane- or latent sulfonic acid-based non-ionized cationic photopolymerization initiator may be used. The onium salt-based initiator may be a diaryliodonium salt, a triarylsulfonium salt or an aryldiazonium salt, the organometallic salt-based initiator may be iron arene, the organic silane-based initiator may be o-nitrobenzyl triaryl silyl ether, triaryl silyl peroxide or acyl silane, and the latent sulfonic acid-based initiator may be α-sulfonyloxy ketone or α-hydroxymethylbenzoin sulfonate, but the present application is not limited.

The above-described initiator may be, for example, a radical initiator. For example, a benzoin-based, hydroxy ketone-based, amino ketone-based or phosphine oxide-based photoinitiator may be used, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-l-phenylpropane-l-one, 1-hydroxycyclohexyl phenyl ketone, 2-methyl-1-[4-(methylthio)phenyl]-2-morpholino-propane-1-one, 4-(2-hydroxyethoxy) phenyl-2-(hydroxy-2-propyl)ketone, benzophenone, p-phenyl benzophenone, 4,4'-diethylaminobenzophenone, dichlorobenzophenone, 2-methylanthraquinone, 2-ethyl anthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo [2-hydroxy-2-methyl-1-[4-(1-methylvinyl)phenyl]propanone] or 2,4,6-trimethylbenzoyl-diphenyl-phosphineoxide may be used.

A content of the initiator in the curable composition may be changed by the type and content ratio of a polymerizable functional group included in the curable composition, or a crosslinking density of the polymer formed of the curable composition. For example, the initiator may be included in the curable composition at 0.1 to 10 parts by weight with respect to 100 parts by weight of the photocurable monomers.

The other aspects may provide a display device including the above mentioned the curable composition.

Figure 2:
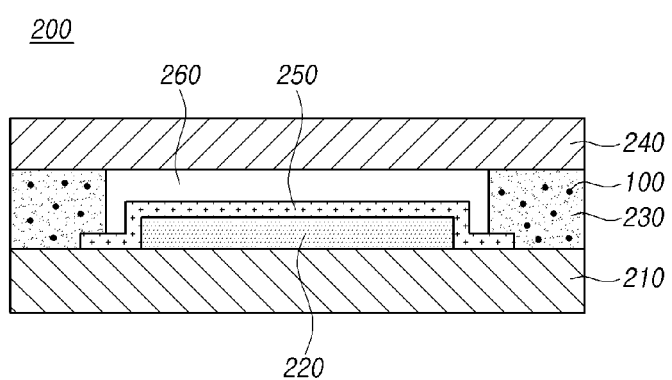
FIG. 2 is a cross-sectional view of a display device according to the aspects.

FIG. 2 is a cross-sectional view of a display device according to the aspects.

Referring to FIG. 2, the display device 200 according to the aspects includes a substrate 210, an organic electric element 220 and an encapsulation part 230.

The type of the substrate 210 is not particularly limited as long as the organic electric element 220 and the thin film transistor for driving the organic electric element 220 can be formed. For example, the substrate 210 may be a plastic substrate or a glass substrate. In addition, the thin film transistor driving the organic electrical element 220 may be positioned on one surface of the substrate 210.

The organic electric element 220 may be located on the substrate 210. For example, the organic electric element 220 may be located on the thin film transistor (not shown) on one surface of the substrate 210.

The organic electric element 220 may be, for example, an organic light emitting diode (OLED). The organic light emitting diode may include a first electrode, an organic layer, and a second electrode sequentially stacked. For example, the first electrode may be an anode electrode, and the second electrode may be a cathode electrode.

The organic electric element 220 may be located in an active area (A/A) of the display device to transmit visual information. A non-active area (N/A) may be located in the peripheral portion of the display device. Electric lines for driving the organic electrical element 220 may be located in the non-active area.

The encapsulation part 230 comprises a hygroscopic particle. The hygroscopic particle comprises a rare earth metal core and a silane surface modification part connected to the metal core. The hygroscopic particle of the display device 200 according to the aspects is substantially the same as the matters regarding the hygroscopic particle contained in the curable composition according to the above-described aspects, unless otherwise described with respect to the display device according to the aspects.

The encapsulation part 230 is positioned on the peripheral portion of the substrate 210, and surrounds a side surface of the organic electric element 220. Since the organic electric element 220 emits light so that the display device 200 may transmit the visual information, it can be located in the active area (A/A) of the display device. The encapsulation part 230 may be positioned on the peripheral portion of the substrate 210 to surround the organic electric element 220 in the central portion of the substrate 210. Therefore, the encapsulation part 230 may prevent the outside material such as oxygen or moisture from entering the organic electric element 220 positioned at the center of the substrate 210 from the outside of the display device 200.

The above-described display device 200 may further include an encapsulation substrate 240 facing the substrate 210. An encapsulation layer for encapsulating the organic electric element 220 may be located on one surface of the encapsulation substrate 240. In addition, a color filter (not shown) is located on one surface of the encapsulation substrate 240 to convert the wavelength of light emitted from the organic electric device 220.

The type of the encapsulation substrate 240 is not particularly limited, and for example, a plastic substrate, a glass substrate, or a metal thin film substrate may be used.

The display device 200 may further include a passivation layer 250. The passivation layer 250 is not particularly limited as long as it can protect the organic electric element 220 and the thin film transistors located under the organic electrical element 220, but may be, for example, an inorganic layer.

The passivation layer 250 may be positioned to cover the upper and side portions of the organic electric element 220. For example, the passivation layer 250 may be formed by plasma enhanced chemical vapor deposition (PECVD). When the passivation layer 250 is formed by the PECVD, the passivation layer 250 may be formed along the surfaces of the upper and side portions of the organic electric element 220. Since the passivation layer 250 is positioned to cover the upper and side portions of the organic electrical element 220, the moisture and the oxygen penetrating the organic electrical element 220 can be effectively prevented.

A portion of the encapsulation part 230 may be located on the passivation layer 250 described above. As illustrated in FIG. 2, a portion of the passivation layer 250 may be located under the encapsulation part 230, and a portion of the encapsulation part 230 may be located on the passivation layer 250. After the organic electric element 220 is formed on the substrate 210, the passivation layer 250 is formed to cover the upper and side portions of the organic electric element 220, and then the encapsulation part 230 is formed so that the above-described structure of the display device 200 may be implemented.

When a portion of the encapsulation part 230 is positioned on the passivation layer 250, the bezel of the display device 200 can be minimized so that the aesthetics of the display device 200 is improved.

The encapsulation part 230 may further include an optically transparent base resin. Since the encapsulation part 230 includes transparent hygroscopic particles and an optically transparent base resin, it may be transparent while having excellent hygroscopicity.

The hygroscopic particle may be dispersed in the base resin. Since the hygroscopic particle have excellent dispersibility, including the silane surface-modification portion, as described above, they can be easily dispersed in the base resin to prevent the encapsulation part 230 from discoloring.

The base resin may be, for example, a (meth) acrylate resin. The (meth) acrylate resin may mean a resin formed by polymerization of monomers containing a (meth) acryloyl group.

The (meth) acrylate resin that can be used as the base resin may be, for example, one or more selected from the group consisting of poly [methyl (meth) acrylate], poly [ethyl (meth) acrylate], poly [butyl (meth) acrylate], poly [Trimethylolpropane tri (meth) acrylate], poly [2-hydroxyethyl (meth) acrylate], poly [2-hydroxypropyl (meth) acrylate], pentaerythritol tri (meth) acrylate, ethylene glycol di (meth) acrylate and 2-ethylhexyl (meth) acrylate.

The display device further comprises a filling resin 260. The filling resin 260 may fill a gap between the organic electric element 220 and the encapsulation substrate 240.

The display device 200 according to the aspects may be a display device in which the organic electrical element 220 is encapsulated in a dam & fill method. The encapsulation part 230 is located in the non-display area (N/A) of the display device 200 as the dam structure, and surrounds the side portion of the organic electrical device 220, and the filling resin 260 function as the fill structure filling the gap between the organic electrical device 220 and the encapsulation substrate 240.

Since the filling resin 260 fills the gap between the organic electrical element 220 and the encapsulation substrate 240 over the display area (A/A) of the display device 200, the type of the filling resin 260 is not particularly limited as long as it is excellent in transparency. For example, the filling resin 260 may use (meth) acrylate resin or epoxy resin.

Figure 3:
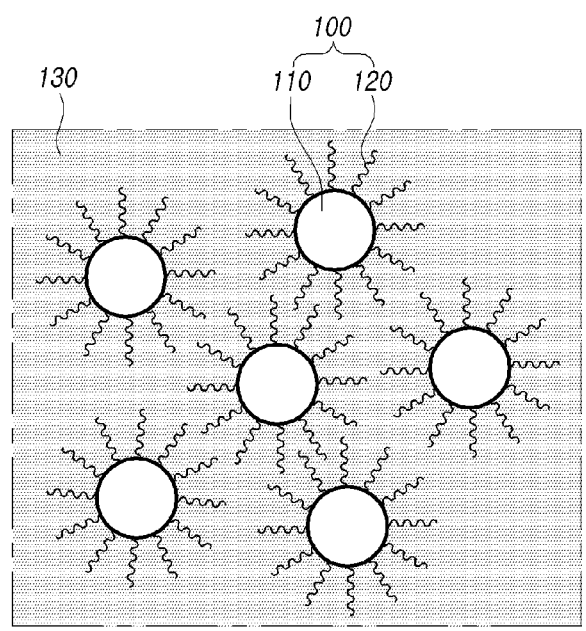
FIG. 3 is a view for explaining an encapsulation part of the display device according to the aspects.

FIG. 3 is a view for explaining an encapsulation part of the display device according to the aspects.

Referring to FIG. 3, the encapsulation part 230 may include the (meth) acrylate resin 130, and the hygroscopic particles 100 may be dispersed in the (meth) acrylate resin 130. The hygroscopic particle 100 may be relatively uniformly dispersed in the (meth) acrylate resin 130 by including the silane surface modification part 120 connected to the metal core 110.

Since the hygroscopic particle 100 is relatively uniformly dispersed in the encapsulation part 230, the encapsulation part 230 may have excellent optical properties. The encapsulation part 230 may have a haze of 10% or less when evaluated according to ASTM D1003 using a Haze Meter HM-150. The upper limit of the aforementioned haze range may be, for example, 9% or less, 7% or less, or 6% or less. The lower limit of the haze range described above is not particularly limited since the lower the haze value is, the better the optical properties are, but may be, for example, 0.1% or more, 0.2% or more, or 0.3% or more.

Since the hygroscopic particle 100 are relatively uniformly dispersed in the encapsulation part 230, the encapsulation part 230 may have excellent transmittance. The encapsulation part 230, for example, may have a transmittance of 85% or more for light having a wavelength of 450 nm. The lower limit of the aforementioned transmittance range may be, for example, 87% or more or 88% or more. The upper limit of the above-described transmittance range is not particularly limited because the higher the transmittance value is, the better the optical properties are, but may be, for example, 99.9% or less or 99% or less.

Hereinafter, the hygroscopic particle 100 and the display device 200 according to the aspects will be described in more detail by the following examples, but the scope of the present disclosure is not limited thereof.

MANUFACTURING EXAMPLE 1

Preparation of Lanthanum Hydroxide (La(OH)3) Nanoparticle

Precursor mixture is prepared by stirring 0.14 g of La(NO3)3.6H2O (Fluka, 99%) as a precursor and 0.29 g of citric acid represented by Chemical Formula 3 in 20 mL of distilled water.

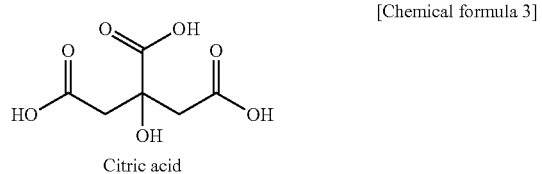 [SMILES: O=C(O)CC(O)(CC(=O)O)C(=O)O]

[Chemical formula 3]

Citric acid 1 g of potassium hydroxide (KOH) is dissolved in 10 mL of ethanol, and then added to the precursor mixture to prepare a mixed solution. The prepared mixed solution is stirred at room temperature for 1 hour (600 rpm/1 h). The stirred mixed solution is transferred to a Teflon liner container and then reacted in a microwave (180° C./1 h). After the reaction, the resulting precipitate is centrifuged and purified at 5,000 rpm/10 min twice with ethanol and secondary distilled water, respectively, and then dried at 80° C. for 6 hours.

According to the above manufacturing example, the following reaction proceeds to produce the lanthanum hydroxide (La(OH)3).

La(NO3)3.6H2O+3KOH→La(OH)3+3KNO3+6H2O

La2O3+3H2O→2La(OH)3

Figure 4:
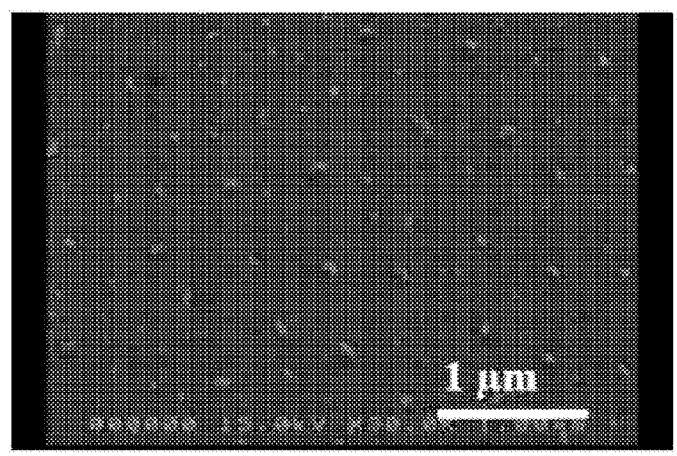
FIGS. 4 and 5 are SEM photographs of the lanthanum hydroxide particle prepared in manufacturing example 1.
Figure 5:
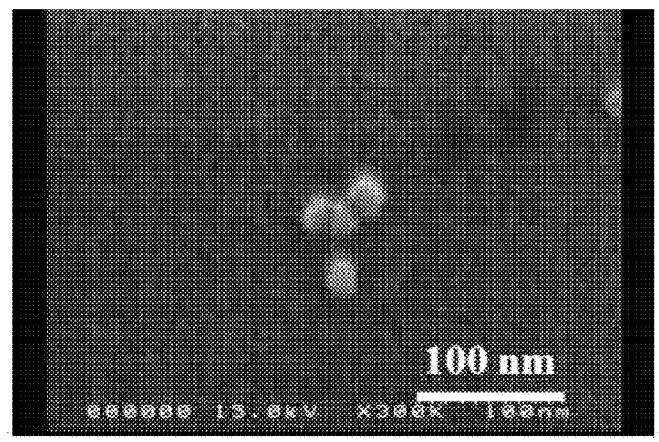

FIGS. 4 and 5 are SEM photographs of the lanthanum hydroxide particle prepared in the above manufacturing example 1. Referring to FIGS. 4 and 5, it can be seen that the diameter of the lanthanum hydroxide (La(OH)3) nanoparticle prepared in manufacturing example 1 is about 10 to 20 nm.

MANUFACTURING EXAMPLE 2

Surface Modification of the Lanthanum Hydroxide (La(OH)$_3$) Nanoparticle

Ethanol and distilled water are added to prepare a 25 mL mixed solution. 0.1 mL of acetic acid is added to the mixed solution to adjust the pH to 3.5.

Prior to the mixed solution, 0.12 g of lanthanum hydroxide nanoparticle prepared in the manufacturing example 1 and 0.24 g of a silane coupling agent are added and stirred for 3 hours to prepare the hygroscopic particle. As the silane coupling agent, 3-(trimethoxysilyl) propyl methacrylate (MPS) is used in aspect 1, and 3-aminopropyltriethoxysilane (APTES) is used in aspect 2.

FIGS. 6 to 10 are FT-IR spectra to determine whether the surface of the lanthanum hydroxide nanoparticle has been modified by silane coupling agents MPS and APTES.

Figure 6:
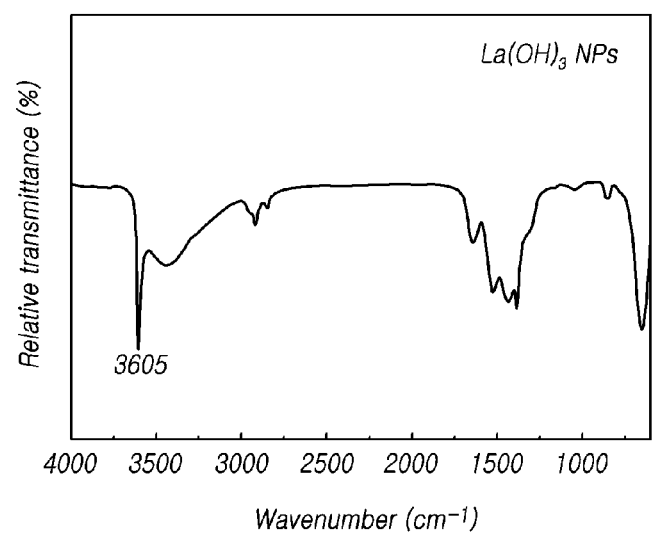
FIGS. 6 to 10 are FT-IR spectra to determine whether the surface of the lanthanum hydroxide nanoparticle has been modified by silane coupling agents MPS and APTES.

FIG. 6 is a FT-IR spectrum of the lanthanum hydroxide (La(OH)3) nanoparticle prepared in the manufacturing example 1.

Figure 7:
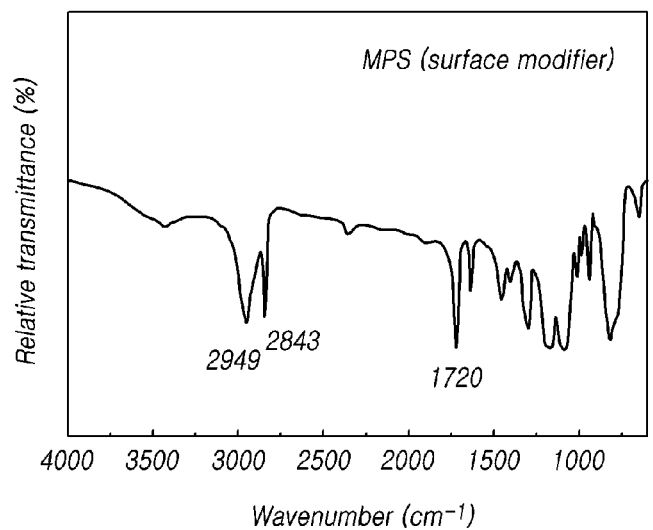

FIG. 7 is a FT-IR spectrum of MPS as the silane coupling agent used in the manufacturing example 2.

Figure 8:
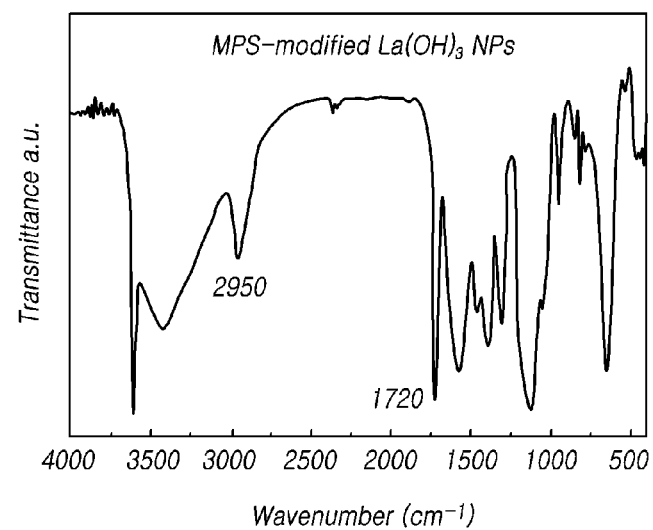

FIG. 8 is a FT-IR spectrum of the hygroscopic particle whose surface is modified with the MPS, prepared in the manufacturing example 2.

Figure 9:
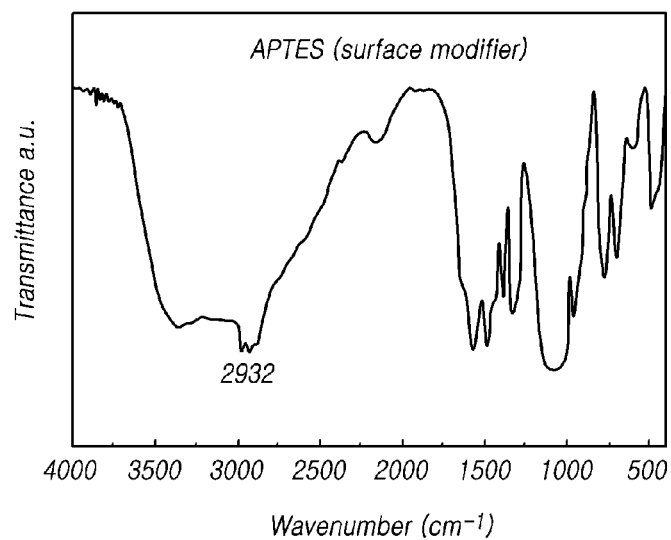

FIG. 9 is a FT-IR spectrum results of APTES as the silane coupling agent used in the manufacturing example 2.

Figure 10:
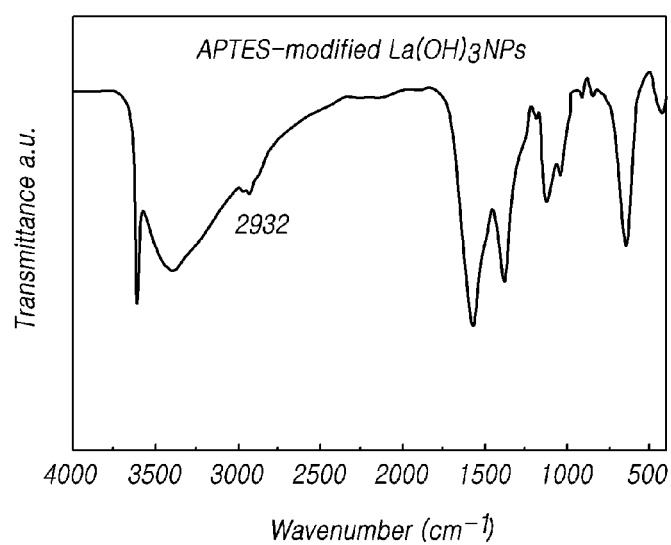

FIG. 10 is a FT-IR spectrum of the hygroscopic particle whose surface is modified with the APTES prepared in the manufacturing example 2.

Referring to FIGS. 6 to 8, a peak at 1720 cm−1 is observed in FIG. 8, which is a peak not observed in FIG. 6. Referring to FIG. 7, since the peak refers to the C═O bond included in the MPS, it can be seen that there is formed the hygroscopic particle including the silane surface modification part containing the C═O bond derived from the MPS by the process of the manufacturing example 2.

Referring to FIGS. 6, 9 and 10, a peak at 2932 cm−1 is observed in FIG. 10, which is a peak not observed in FIG. 6. Referring to FIG. 9, since this peak represents a C—H bond included in the APTES, it can be seen that there is formed the hygroscopic particles including a silane surface modification part including a C—H bond derived from the APTES by the process of manufacturing example 2.

EXPERIMENTAL EXAMPLE 1

Dispersion of the Hygroscopic Particle in Resin and Evaluation of Optical Properties of a Resin Thin Film Including the Hygroscopic Particle 0.05 g of the hygroscopic nanoparticle of the aspect 1, 4.95 g of a (meth) acrylate monomer, and an ultraviolet curing initiator were mixed at 1% by weight, followed by stirring to prepare the curable composition (aspect 3).

0.10 g of the hygroscopic nanoparticle of the aspect 1, 4.90 g of a (meth) acrylate monomer and an ultraviolet curing initiator were mixed at 1% by weight, followed by stirring to prepare the curable composition (aspect 4).

0.25 g of the hygroscopic nanoparticles of the aspect 1, 4.75 g of a (meth) acrylate monomer and an ultraviolet curing initiator were mixed at 1% by weight, followed by stirring to prepare the curable composition (aspect 5).

0.05 g of the hygroscopic nanoparticle of the aspect 2, 4.95 g of a (meth) acrylate monomer, and an ultraviolet curing initiator were mixed at 1% by weight, followed by stirring to prepare the curable composition (aspect 6).

0.10 g of the hygroscopic nanoparticle of the aspect 2, 4.90 g of a (meth) acrylate monomer, and an ultraviolet curing initiator were mixed at 1% by weight, followed by stirring to prepare the curable composition (aspect 7).

0.25 g of the hygroscopic nanoparticle of the aspect 2, 4.75 g of a (meth) acrylate monomer and an ultraviolet curing initiator were mixed at 1% by weight, followed by stirring to prepare the curable composition (aspect 8).

5.00 g of a (meth) acrylate monomer and a curing initiator were mixed at 1% by weight, followed by stirring to prepare the curable composition (comparative example 1).

0.05 g of the lanthanum hydroxide nanoparticle of the manufacturing example 1, 4.95 g of (meth) acrylate monomer and an ultraviolet curing initiator at 1% by weight, followed by stirring to prepare the curable composition (comparative example 2).

0.10 g of lanthanum hydroxide nanoparticle of the manufacturing example 1, 4.90 g of (meth) acrylate monomer and an ultraviolet curing initiator were mixed at 1% by weight, followed by stirring to prepare a curable composition (comparative example 3).

0.25 g of lanthanum hydroxide nanoparticle of the manufacturing example 1, 4.75 g of (meth) acrylate monomer and an ultraviolet curing initiator were mixed at 1% by weight, followed by stirring to prepare a curable composition (comparative example 4).

Figure 11:
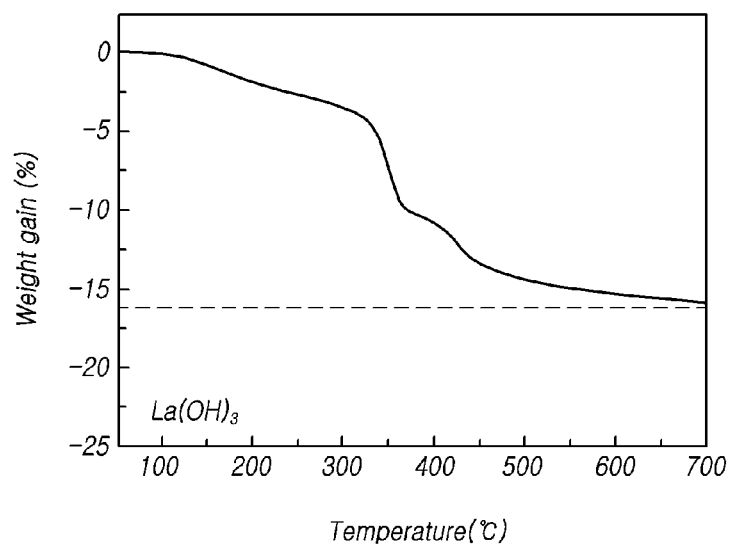
FIGS. 11 to 13 are thermal gravimetric analysis (TGA) results of the lanthanum hydroxide nanoparticle and the hygroscopic nanoparticles according to the manufacturing examples 1 and 2.
Figure 12:
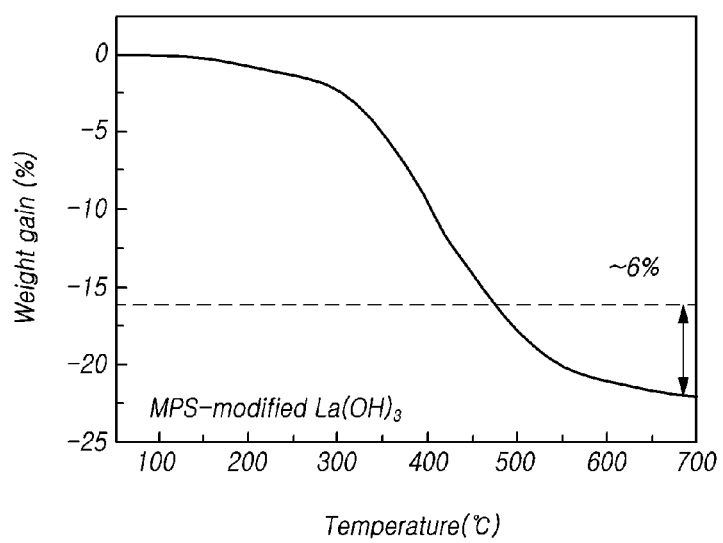
Figure 13:
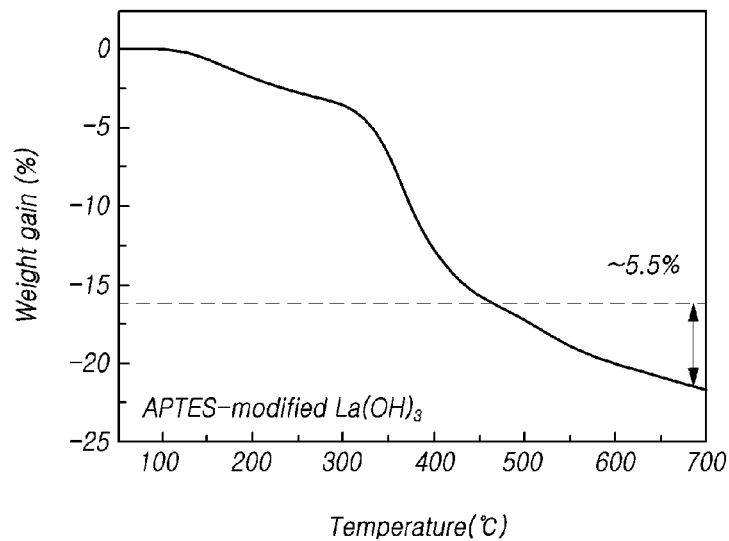

FIGS. 11 to 13 are thermal gravimetric analysis (TGA) results of the lanthanum hydroxide nanoparticle and the hygroscopic nanoparticles according to the manufacturing examples 1 and 2.

FIG. 11 is the TGA result of the lanthanum hydroxide nanoparticle prepared in the manufacturing example 1, FIG. 12 is the TGA result of the hygroscopic particles whose surface is modified with the MPS prepared in the manufacturing example 2, and FIG. 13 is the TGA result of the hygroscopic particles whose surface is modified with the APTES prepared in the manufacturing example 2.

Referring FIGS. 11 to 13, it can be seen that when the mass change due to the temperature increase after the surface modification reaction is compared with that before the surface modification reaction at 700° C., the difference of those according to the surface modification reaction by the MPS and APTES are 6% (see FIG. 10) and 5.5% (see FIG. 11), respectively. This difference may be due to the mass of the reactors bound to the surface of the lanthanum hydroxide nanoparticle as a result of surface modification of the lanthanum hydroxide nanoparticles prepared in the manufacturing example 1 according to the manufacturing example 2.

Figure 14:
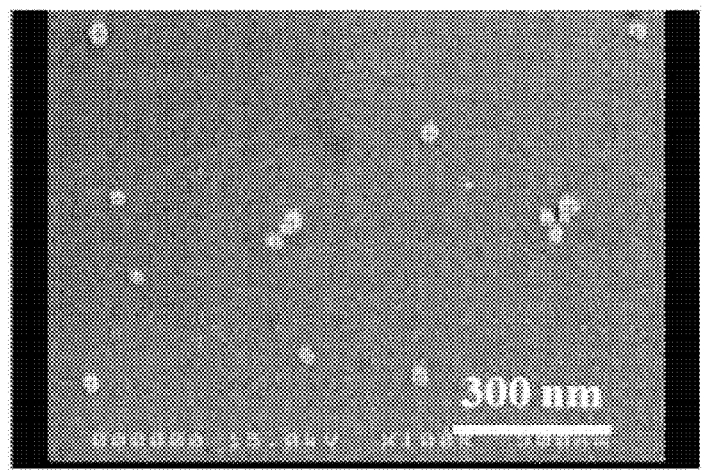
FIG. 14 is an SEM photograph of the lanthanum hydroxide nanoparticle prepared in a manufacturing example 1.

FIG. 14 is an SEM photograph of the lanthanum hydroxide nanoparticle prepared in a manufacturing example 1.

Figure 15:
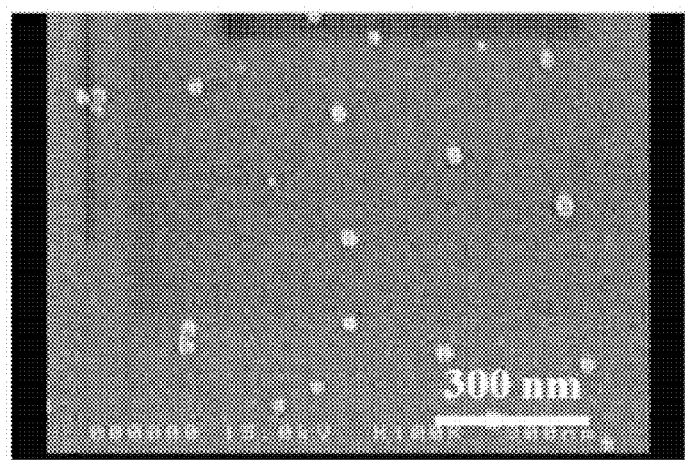
FIG. 15 is an SEM photograph of hygroscopic nanoparticle whose surface is modified with the MPS prepared in the manufacturing example 2.

FIG. 15 is an SEM photograph of hygroscopic nanoparticle whose surface is modified with the MPS prepared in the manufacturing example 2.

Figure 16:
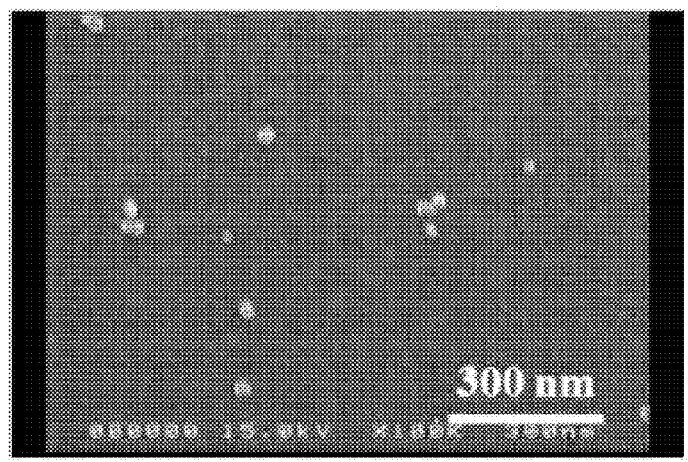
FIG. 16 is an SEM photograph of the hygroscopic nanoparticle whose surface is modified with the APTES prepared in the manufacturing example 2.

FIG. 16 is an SEM photograph of the hygroscopic nanoparticle whose surface is modified with the APTES prepared in the manufacturing example 2.

Referring to FIGS. 14 and 15, it can be seen that the morphology change of the nanoparticle did not occur even though the surface modification was performed under acidic conditions of pH 3.5. Referring to FIGS. 14 and 16, it can be seen that the morphology change of the nanoparticles did not occur even though the surface modification was performed under acidic conditions of pH 3.5. Therefore, it can be expected that properties such as the quantum confinement effect of the lanthanum hydroxide nanoparticles due to the surface modification will be maintained even in the surface-modified hygroscopic nanoparticles.

Figure 17:
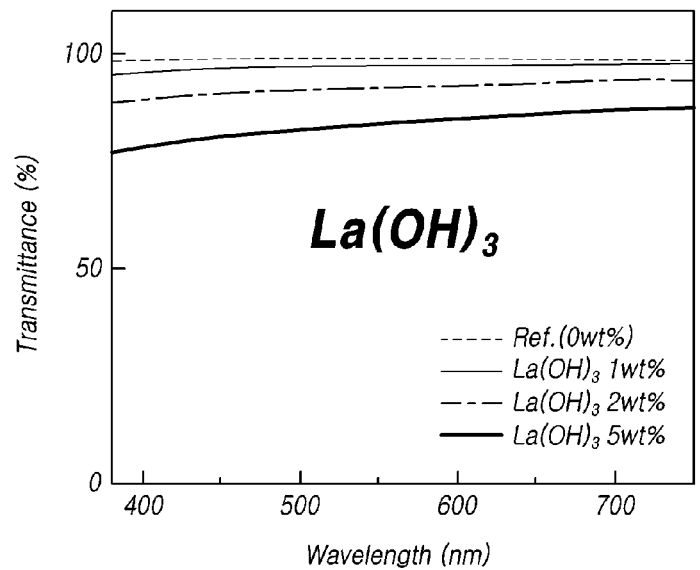
FIGS. 17 to 19 are data for measuring the optical properties of the films prepared using the curable compositions of the aspects 3 to 8 and comparative examples 1 to 4.
Figure 18:
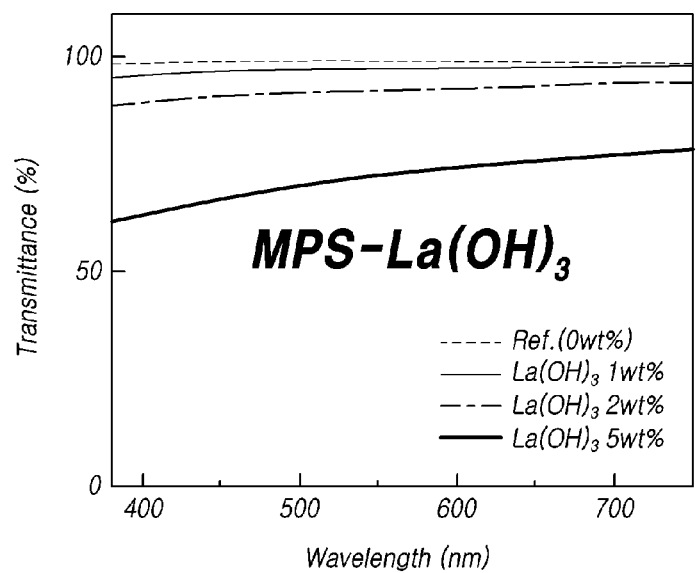
Figure 19:
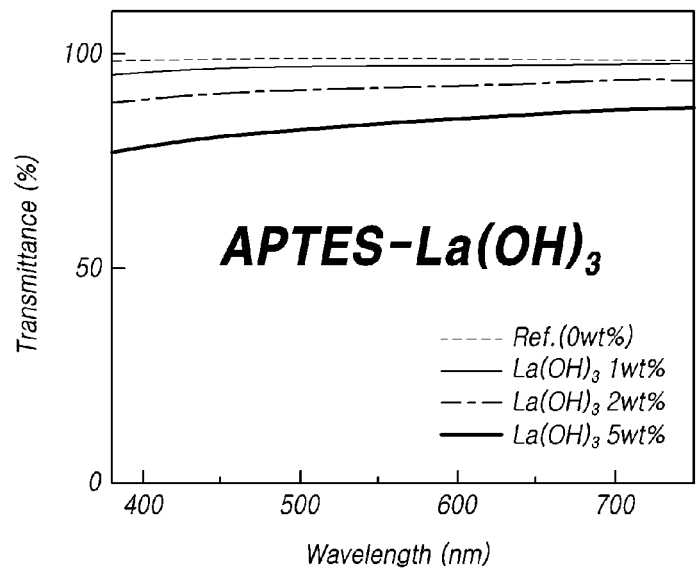

FIGS. 17 to 19 are data for measuring the optical properties of the films prepared using the curable compositions of the aspects 3 to 8 and comparative examples 1 to 4.

The film measuring optical properties in FIGS. 17 to 19 is formed to a thickness of 10 μm after the curable compositions of aspects 3 to 8 and comparative examples 1 to 4 are coated through bar-coating, and then cured with a UV lamp.

Referring to FIG. 17, it can be seen that the comparative example 1 in which lanthanum hydroxide was not included has the highest permeability, and its permeability decreases as the content of lanthanum hydroxide increases.

Referring to FIG. 18, it can be seen that the comparative example 1 in which the hygroscopic particles was not included has the highest permeability, and its permeability decreases as the content of the hygroscopic particle whose surface is modified with the MPS increases.

Referring to FIG. 19, it can be seen that the comparative example 1 in which the hygroscopic particles was not included has the highest permeability, and its permeability decreases as the content of the hygroscopic particle whose surface is modified with the APTES increases.

The results of FIGS. 17 to 19 are shown in Table 1 below.

TABLE 1

| | Hygroscopic Particle | Content of Hygroscopic Particle (Wt %) | Transmittance (%) (at 450 nm) | Haze (%) |
|---|---|---|---|---|
| Aspect 3 | MPS-La(OH)$_3$ | 1 | 98.41 | 1.8 |
| Aspect 4 | MPS-La(OH)$_3$ | 2 | 92.46 | 4.7 |
| Aspect 5 | MPS-La(OH)$_3$ | 3 | 68.06 | 21.8 |
| Aspect 6 | APTES-La(OH)$_3$ | 1 | 95.79 | 3.0 |
| Aspect 7 | APTES-La(OH)$_3$ | 2 | 90.58 | 6.0 |
| Aspect 8 | APTES-La(OH)$_3$ | 3 | 80.73 | 12.1 |
| Comparative example 1 | — | 0 | 99.14 | 0.6 |
| Comparative example 2 | La(OH)$_3$ | 1 | 92.11 | 5.4 |
| Comparative example 3 | La(OH)$_3$ | 2 | 88.19 | 5.6 |
| Comparative example 4 | La(OH)$_3$ | 3 | 82.59 | 13.5 |

Although the comparative example 1 is measured to the highest permeability, it does not include the hygroscopic particle, and thus the anti-moisture characteristics are very poor as a result of anti-moisture characteristics tests as described below. On the other hand, it can be seen that the aspects 3 to 8 include the hygroscopic particle so that they may has more excellent hygroscopicity, and better light transmittance and haze characteristics than the comparative examples 2 to 4.

EXPERIMENTAL EXAMPLE 2

Evaluation of Anti-Moisture Characteristics of Resin Including Nanoparticles

A cobalt chloride paper for measuring the moisture permeation was dried at 100° C. for one hour and then placed on a glass substrate.

Figure 20:
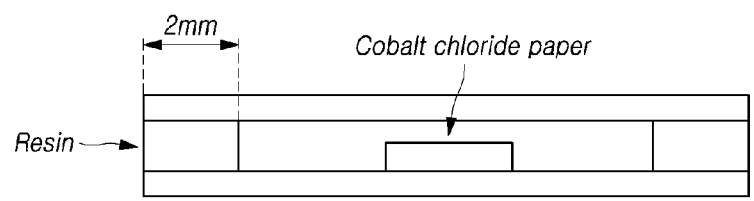
FIG. 20 is a cross-sectional view of a sample prepared to evaluate anti-moisture properties.

FIG. 20 is a cross-sectional view of a sample prepared to evaluate anti-moisture properties.

Referring to FIG. 20, the curable compositions of the aspects 3 to 8 and the comparative example 1 was coated to a glass cell having a gap of 2 mm so as to seal the cobalt chloride paper.

After curing the portion to which the curable composition was coated using an ultraviolet lamp (300 mW/cm3) for 1 minute, the sample shown in FIG. 20 was placed on a thermo-hygrostat having 85° C. and 85% relative humidity.

Figure 21:
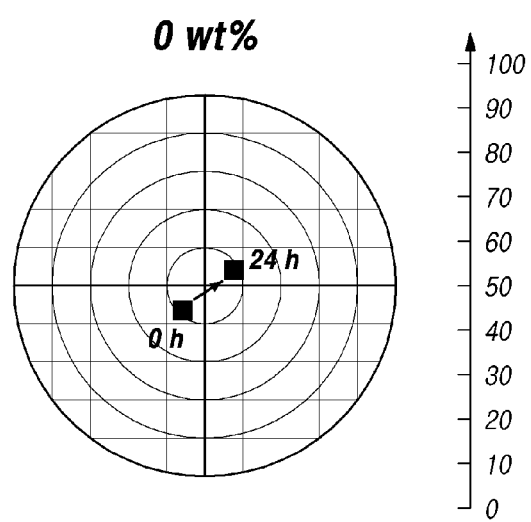
FIG. 21 is a view showing the color change of the cobalt chloride paper encapsulated using the curable composition of the comparative example 1.

FIG. 21 is a view showing the color change of the cobalt chloride paper encapsulated using the curable composition of the comparative example 1.

Figure 22:
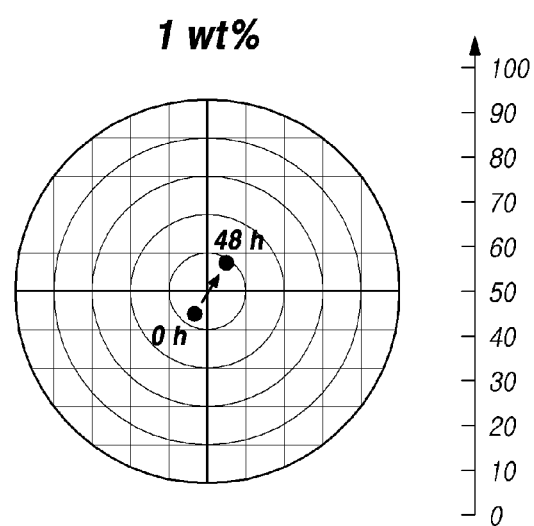
FIGS. 22 to 24 are a view showing the color change of the cobalt chloride paper encapsulated using the curable composition according to the aspects 3 to 5.
Figure 23:
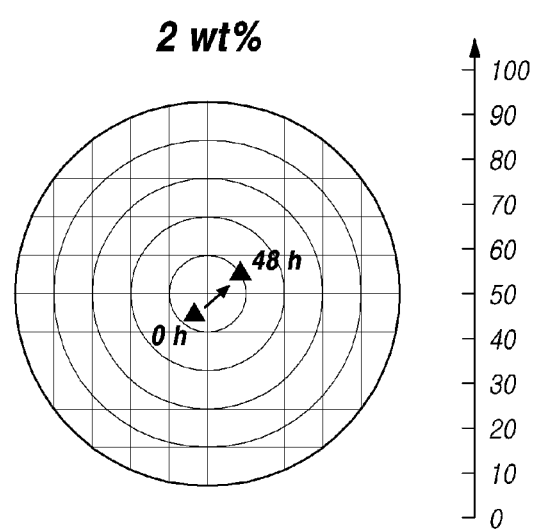
Figure 24:
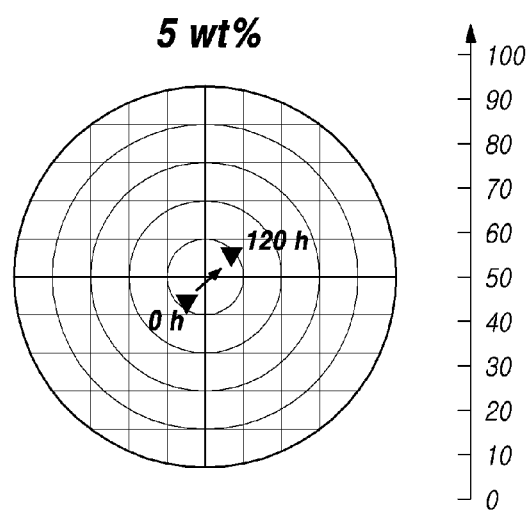

FIGS. 22 to 24 are a view showing the color change of the cobalt chloride paper encapsulated using the curable composition according to the aspects 3 to 5.

Referring to FIGS. 21 to 24, it can be seen that the color of the cobalt chloride paper encapsulated using the curable composition of the comparative example 1, which does not include the hygroscopic particle, is changed after 24 hours (24 h) in FIG. 21, but the color of the cobalt chloride paper encapsulated using the curable composition of the aspects 3 to 5, which includes the lanthanum hydroxide nanoparticles whose surface is modified with the MPS, is discolored after as little as 48 hours and as long as 120 hours. Therefore, it can be seen that the curable composition comprising the hygroscopic nanoparticle whose surface is modified with the MPS provides an encapsulation portion having more excellent anti-moisture performance.

Figure 25:
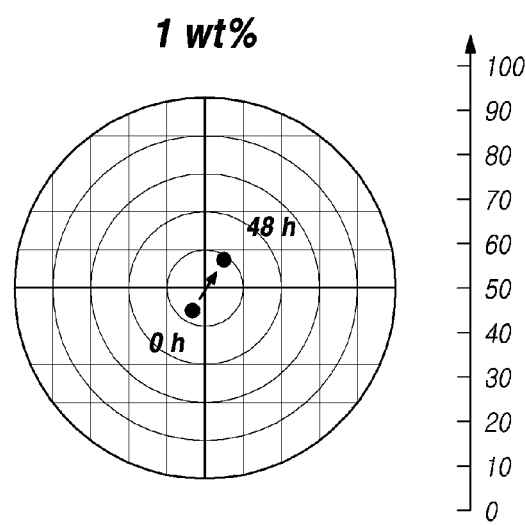
FIGS. 25 to 27 are a view showing the color change of the encapsulated cobalt chloride paper using the curable compositions according to the aspects 6 to 8.
Figure 26:
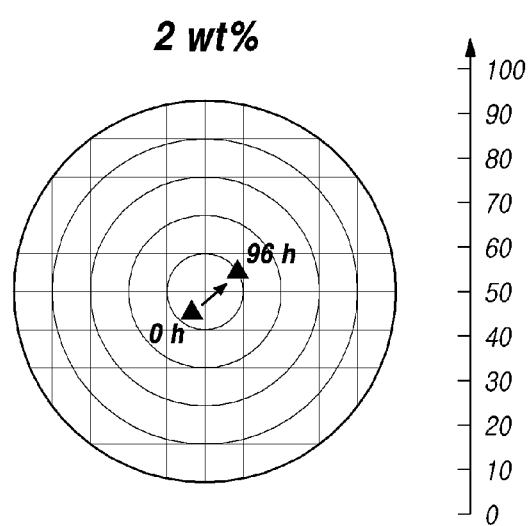
Figure 27:
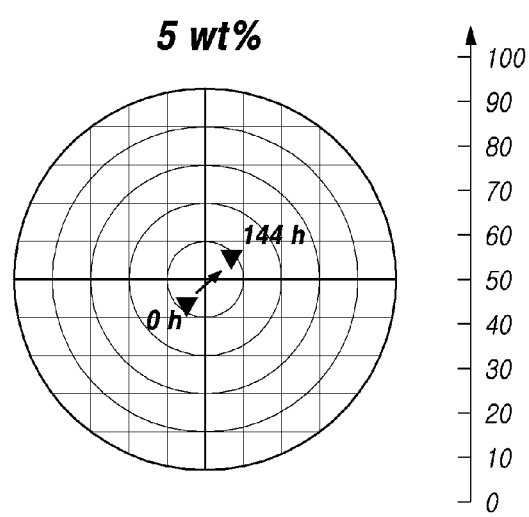

FIGS. 25 to 27 are a view showing the color change of the encapsulated cobalt chloride paper using the curable compositions according to the aspects 6 to 8.

Referring to FIGS. 21 and 25 to 27, it can be seen that the color of the cobalt chloride paper encapsulated using the curable composition of the comparative example 1, which does not include the hygroscopic particle, is changed after 24 hours (24 h) in FIG. 21, but the color of the cobalt chloride paper encapsulated using the curable composition of the aspects 6 to 8, which includes the lanthanum hydroxide nanoparticles whose surface is modified with the APTES, is discolored after as little as 48 hours and as long as 144 hours. Therefore, it can be seen that the curable composition comprising the hygroscopic nanoparticle whose surface is modified with the APTES provides an encapsulation portion having more excellent anti-moisture performance.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A curable composition comprising:
   A hygroscopic particle comprising a metal core comprising a rare earth metal and a silane surface modification part connected to the metal core; and
   a photocurable monomer,
   wherein the metal core comprises a hydroxide of the rare earth metal.

2. The curable composition according to claim 1, wherein the metal core comprises one or more of lanthanum (La); Scandium (Sc); Yttrium (Y); Cerium (Ce); Neodymium (Nd); Promethium (Pm); Samarium (Sm); Gadolinium (Gd); Terbium (Tb); Holmium (Ho); Erbium (Er); Tolium (Tm); Ytterbium (Yb); and ruthenium (Lu).

3. The curable composition according to claim 1, wherein the silane surface modification part is formed by dehydration condensation reaction between a silane coupling agent and the rare earth metal.

4. The curable composition according to claim 3, wherein the silane coupling agent is one or more of 3-methacryloxypropyl trimethoxysilane; 3-methacryloxypropyltriethoxysilane; Vinyl trimethoxysilane; Vinyl triethoxysilane; Methacryloxymethyltrimethoxysilane; Methacryloxymethyltriethoxysilane; 3-aminopropyltriethoxysilane; 3-aminopropyltrimethoxysilane; 3-mercaptoacryloxypropyl trimethoxysilane; 3-mercaptoacryloxypropyltriethoxysilane; 3-glycidoxypropyltrimethoxysilane; 3-glycidoxypropyltriethoxysilane; N-phenyl aminopropyl trimethoxysilane; N -phenylaminopropyltriethoxysilane; and hexamethyldisilazane.

5. The curable composition according to claim 1, wherein a diameter of the hygroscopic particles is 1 nm to 100 nm.

6. The curable composition according to claim 1, wherein the hygroscopic particle comprises a partial structure represented by the following chemical formula 1 on the surface:

$$Si(OX)_a Y_b \qquad \text{[Chemical Formula 1]}$$

in the chemical Formula 1,
a and b are each an integer from 1 to 3, a+b is 4,
X is a metal atom of the metal core,
Y is, independently of each other, a hydroxy group, an alkyl group of C1-C20, or an alkenyl group of C2-C20, and
wherein the alkyl group and the alkenyl group is substituted or unsubstituted with at least one of an acryloxy group, a methacryloxy group, an amine group, a mercaptoacryloxy group, a mercaptomethacryloxy group, and a glycidoxy group, respectively.

7. The curable composition according to claim 1, wherein the photocurable monomer comprises a (meth) acryloyl group.

8. The curable composition according to claim 1, wherein the hygroscopic particle includes 0.1 to 5 parts by weight, and the photocurable monomer includes 90 to 99.9 parts by weight.

9. The curable composition according to claim 1, further comprising an initiator.

10. A display device comprising:
a substrate;
an organic electric element located on the substrate; and
an encapsulation part comprising a hygroscopic particle comprising a rare earth metal core and a silane surface modification part connected to the metal core and positioned on a peripheral portion of the substrate and surrounding a side surface of the organic electric element wherein the metal core comprises a hydroxide of the rare earth metal.

11. The display device according to claim 10, wherein the encapsulation part further comprises a (meth) acrylate resin, and
wherein the hygroscopic particle is dispersed in the (meth) acrylate resin.

12. The display device according to claim 11, wherein the encapsulation part includes a haze of 10% or less.

13. The display device according to claim 11, wherein the encapsulation part has a transmittance of 85% or higher for light with a wavelength of 450 nm.

14. The display device according to claim 11, further comprising:
an encapsulation substrate facing the substrate,
a color filter positioned on one surface of the encapsulation substrate, and
a thin film transistor positioned on one surface of the substrate.

15. The display device according to claim 14, further comprising a passivation layer positioned to cover the upper and side portions of the organic electric element,
wherein a portion of the encapsulation part is located on the passivation layer.

16. The display device according to claim 14, further comprising a filling resin filling a gap between the organic electric element and the encapsulation substrate.

* * * * *